United States Patent [19]

Davies et al.

[11] Patent Number: 5,155,563
[45] Date of Patent: Oct. 13, 1992

[54] SEMICONDUCTOR DEVICE HAVING LOW SOURCE INDUCTANCE

[75] Inventors: Robert B. Davies, Tempe; Robert J. Johnsen, Scottsdale; Francine Y. Robb, Tempe, all of Ariz.

[73] Assignee: Motorola, Inc., Schaumburg, Ill.

[21] Appl. No.: 670,654

[22] Filed: Mar. 18, 1991

[51] Int. Cl.⁵ .................................. H01L 29/78
[52] U.S. Cl. .................... 357/23.4; 357/23.1
[58] Field of Search .................... 357/23.4, 23.1

[56] References Cited

U.S. PATENT DOCUMENTS 4,908,682 3/1990 Takahashi ............... 357/23.4

FOREIGN PATENT DOCUMENTS 0280535 8/1988 European Pat. Off. ........... 357/23.4
0141965 9/1982 Japan ........................... 357/23.4

OTHER PUBLICATIONS

Itoh et al., "Entremely High Efficient UHF Power MOSFET for Handy Transmitter", IEDM, 1983, pp. 95-97.

Primary Examiner—Georgia Y. Epps
Attorney, Agent, or Firm—Miriam Jackson

[57] ABSTRACT

A semiconductor device having a low source inductance are fabricated by having a maximum of two sources each in contact with a region which makes contact to a substrate or back side of the device. The back side source contact also allows the device to be mounted directly to a grounded heatsink.

9 Claims, 3 Drawing Sheets

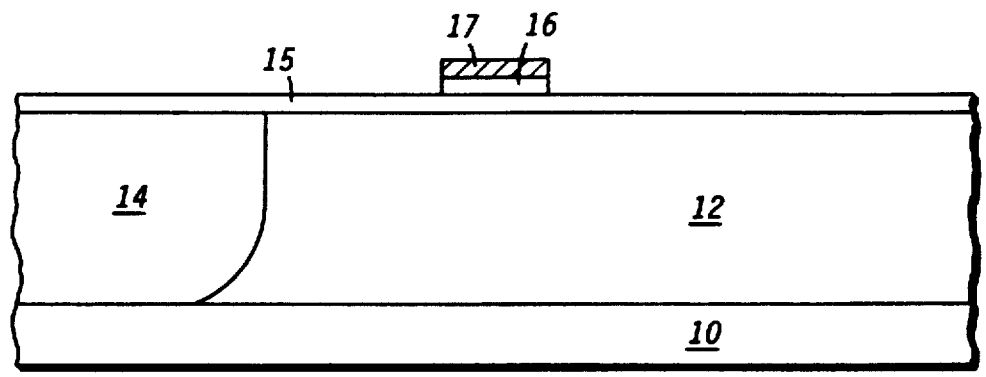
FIG. 1
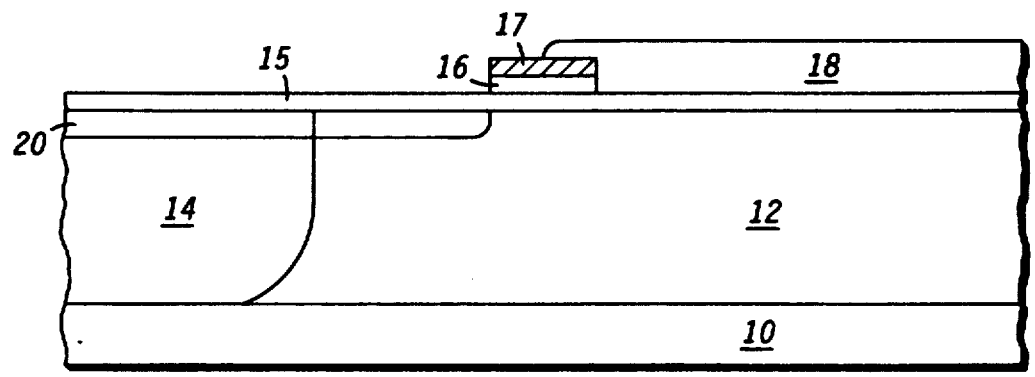
FIG. 2
FIG. 3
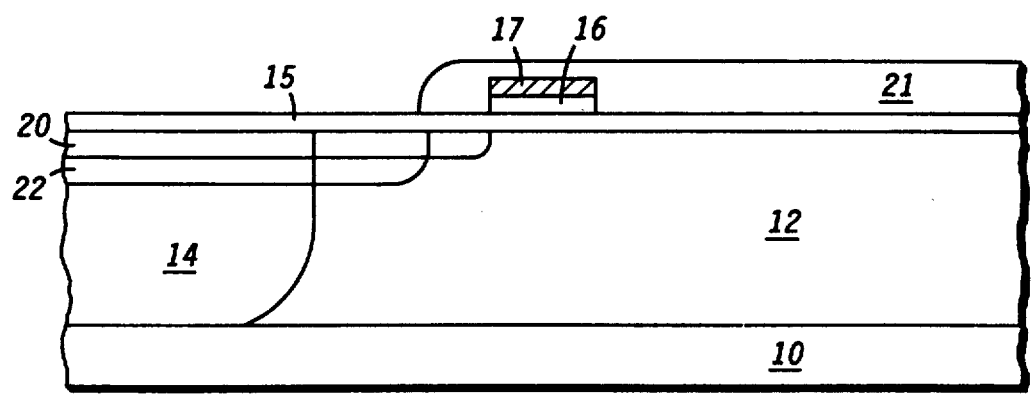

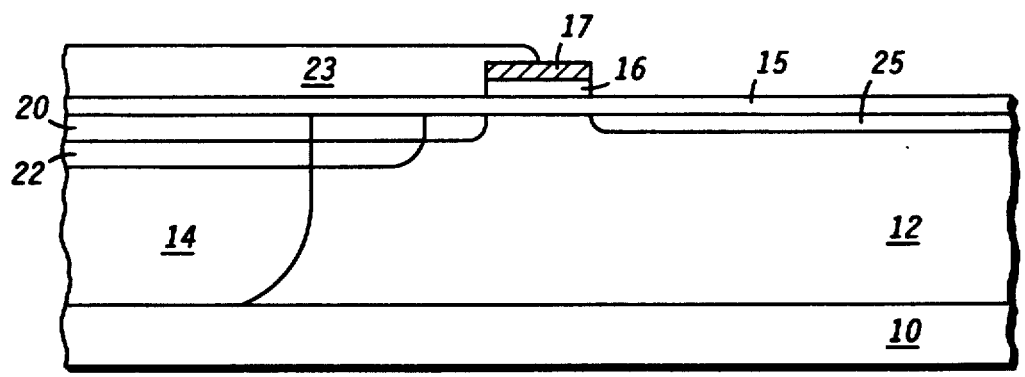
FIG. 4
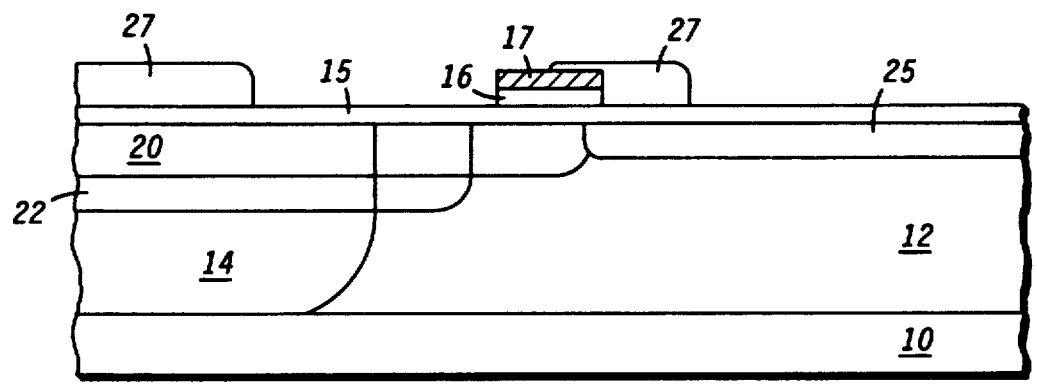
FIG. 5
FIG. 6
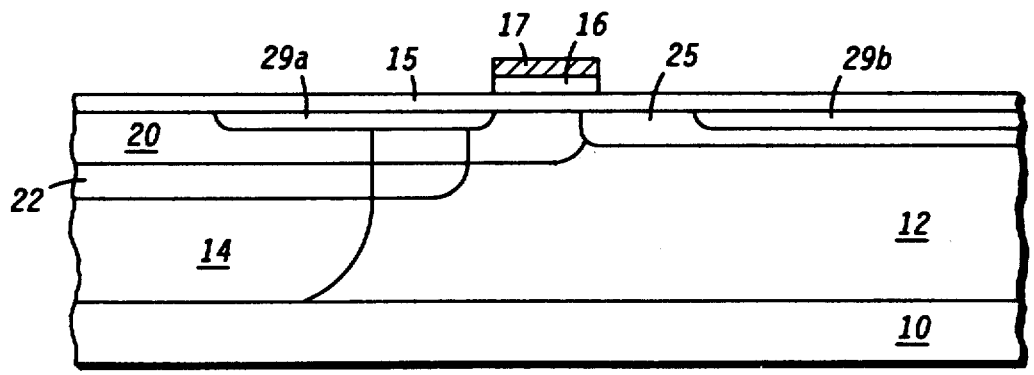

SEMICONDUCTOR DEVICE HAVING LOW SOURCE INDUCTANCE

BACKGROUND OF THE INVENTION

This invention relates, in general, to semiconductor devices, and more particularly, to Radio Frequency (RF) semiconductor devices having a low source inductance.

RF power devices are used in communication applications, for example, as amplifiers in output stages of transmitters in cellular radios. RF amplifiers are used in a grounded source configuration. In typical RF power devices, the back side of the die is usually the drain of the device. It would be desirable to have the source be the back of the die because it can be easily grounded to a heatsink. This configuration is also desirable because heat may be conducted away by the heatsink. If the back side of the die is the drain, the die must be mounted on beryllium oxide or another insulator to separate the drain from the grounded heatsink. If the back side of the die is the source, then the die may be directly mounted to the heatsink or other groundplane. This would eliminate the use of beryllium oxide, which is expensive and highly toxic.

An RF power device having a back side source has been fabricated. In this device, electrical contact is made to a multitude of source regions on the top side of the die using a single metal interconnect layer. This metal interconnect layer connects the multitude of source regions to a single P+ region which is in contact with the substrate, or the back-side of the die. Although the back side source contact is advantageous, this particular configuration results in high source inductance, which means that the device will exhibit a lower gain. Thus, it would be desirable to fabricate an RF power device that has a low source inductance. In addition, this device requires the use of a double layer metal process. A separate metal layer is required to make electrical contact to the gate and the drain of the device. It would be desirable, in order to simplify and lessen the cost of manufacturing, to fabricate an RF power device having a back-side source, but with a single layer metal process.

SUMMARY OF THE INVENTION

A semiconductor device, comprising a substrate of a first conductivity type, an epitaxial layer of the first conductivity type formed on the substrate, a plurality of source and drain regions of a second conductivity type formed in the epitaxial layer, and a plurality of first regions of the first conductivity type, formed in the epitaxial layer which will be used in conjunction with an ohmic conductive means to connect the substrate to the source regions.

BRIEF DESCRIPTION OF THE DRAWING

FIGS. 1-7 illustrate enlarged, cross-sectional views of a portion of an embodiment of the present invention in various stages of fabrication.

DETAILED DESCRIPTION OF A PREFERRED EMBODIMENT

Figure 7:
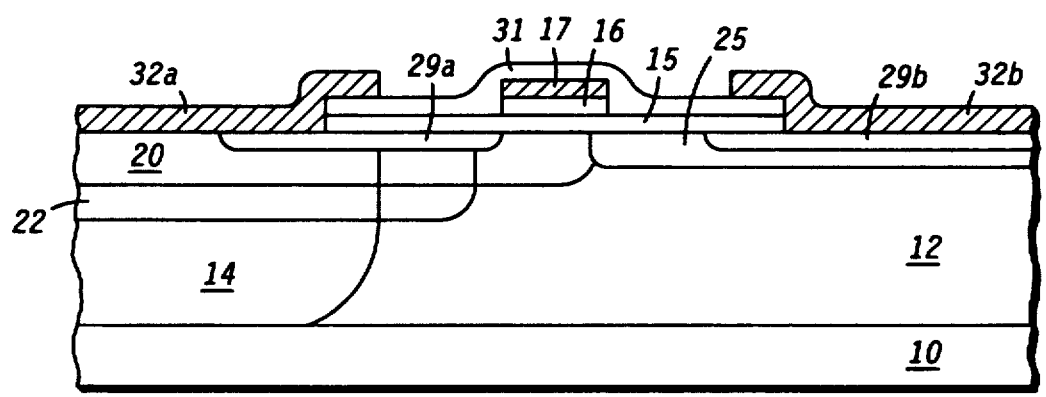

FIG. 1 illustrates an enlarged, cross-sectional view of a portion of an embodiment of the present invention in a beginning stage of fabrication. What is shown is a semiconductor substrate 10 of a first conductivity type. In this embodiment, substrate 10 is a P+ type silicon substrate and forms the back side of the semiconductor die. An epitaxial layer 12, also of the first conductivity type, is formed on substrate 10 by processes well known in the art. Epitaxial layer 12, in this embodiment, is preferably P− type epitaxial silicon. Next, a first region 14 of the first conductivity type is formed in epitaxial layer 12. First region 14 is preferably more heavily doped than epitaxial layer 12 or P+ type. First region 14 is also formed by processes well known in the art, such as ion implantation and diffusion. It is not necessary, but it is desirable, that first region 14 be in physical contact with substrate 10 now or at the end of the process because conductive means to substrate 10 is still provided by first region 14. Subsequently, a gate region comprising a gate oxide layer 15, a gate polysilicon layer 16, and an optional gate silicide layer 17 are formed on epitaxial layer 12, and gate polysilicon layer 16 and optional gate silicide layer 17 are patterned using standard photolithographic and etch techniques. Gate silicide layer 17 is preferably comprised of tungsten-silicon, however, other refractory metal silicides may be used.

FIG. 2 illustrates the structure of FIG. 1 further along in processing. A photoresist layer 18 is formed to prevent dopants from penetrating a portion of epitaxial layer 12. Photoresist layer 18 is formed partially over gate silicide 17 and over epitaxial layer 12 adjacent the side of gate polysilicon layer 16 and gate silicide layer 17 where first region 14 is not formed. A second region 20 of the first conductivity type is then formed in epitaxial layer 12 in the region where photoresist mask 18 is not disposed. Second region 20 is preferably formed by a standard ion implantation process. Second region 20 is preferably more lightly doped than first region 14.

FIG. 3 illustrates the structure of FIG. 2 further along in processing. A photoresist layer 21 is formed to prevent dopants from penetrating a portion of epitaxial layer 12. Photoresist layer 21 is formed over gate silicide 17 and over epitaxial layer 12 adjacent the side of gate polysilicon layer 16 and gate silicide layer 17 where first region 14 is not formed and partially over epitaxial layer 12 where second region 20 is formed. A third region 22 of the first conductivity type is then formed in epitaxial layer 12 in the region where photoresist mask 21 is not disposed. Third region 22 is also preferably formed by a standard ion implantation process. Third region 22 is preferably more heavily doped than second region 20, but more lightly doped than first region 14.

FIG. 4 illustrates the structure of FIG. 3 further along in processing. A photoresist layer 23 is formed to prevent dopants from penetrating a portion of epitaxial layer 12. Photoresist layer 23 is formed partially over gate silicide layer 17 and over epitaxial layer 12 adjacent the side of gate polysilicon layer 16 and gate silicide layer 17 where first region 14, second region 20 and third region 22 are formed. Subsequently, a fourth region 25 of a second conductivity type is formed in epitaxial layer 12 where photoresist layer 23 is not disposed. Fourth region 25 is also preferably formed by a standard ion implantation process, and preferably doped N type. Fourth region 25 acts as part of the drain of the device.

FIG. 5 illustrates the structure of FIG. 4 further along in processing. Second region 20, third region 22, and fourth region 25 are diffused further into epitaxial layer 12 together in one high temperature step. Of course, each region can be diffused after ion implantation, however, if done together, processing time is reduced. After the diffusion, a photoresist layer 27 is formed on epitaxial layer 12 a portion which extends partially over gate silicide 17 over a portion of fourth region 25 and another portion of which extends partially over first region 14, second region 20, and third region 22.

FIG. 6 illustrates the structure of FIG. 5 further along in processing. A fifth region 29a and a sixth region 29b are formed preferably by ion implanting a dopant of the second conductivity type into epitaxial layer 12 where photoresist layer 27 is not present. Fifth region 29a acts as the source, while sixth region 29b acts as the drain of the device. The drain region is thus comprised of a lightly doped region, region 25, and a more heavily doped region, region 29b. Fourth region 25 acts to increase the breakdown voltage capability of the device. Second region 20 acts as the channel region for the transistor. Third region 22 acts to increase the ruggedness of the device by lowering the series base resistance of the parasitic bipolar transistor formed by fourth region 25, second region 20 and fifth region 29a, and is not absolutely necessary for forming a working device.

FIG. 7 illustrates the structure of FIG. 6 further along in processing. An insulating layer 31 is formed and patterned over gate silicide layer 17 and on gate oxide layer 15 over a portion of epitaxial layer 12 surrounding gate silicide layer 17. Insulating layer 31 may be a single layer or a combination of different insulating layers. Subsequently, ohmic conductive means or a metal layer is formed and patterned to form a drain metal layer 32b, and a source metal layer 32a. Contact is also made to gate silicide layer 17 (not shown) with this same metal layer. The completion of such devices is well known in the art, and thus will not be further described.

As can be seen, a back-side source semiconductor device, having low source inductance has been fabricated. This power FET is optimized for use in RF applications. Source metal layer 32a electrically connects or shorts together fifth region 29a and first region 14 on the top surface of the die, therefore source region 29a is grounded to substrate 10 through first region 14. To fabricate a whole device, a plurality of cells, including a single region that is connected to the substrate. The device of the present invention also has the advantage that a back side source device has. Because the source is on the back side, the die may be directly mounted to a heatsink. Thus, the use of beryllium oxide is eliminated. Note also that a single level metal process has been used because only a single level of metal on the top surface is required to perform all necessary interconnects to the source, drain and gate regions, thus simplifying and lowering the cost of fabricating the device.

We claim:

1. A semiconductor device, comprising:
   a substrate of a first conductivity type;
   an epitaxial layer of the first conductivity type formed on the substrate;
   a plurality of channel regions of the first conductivity type formed in the epitaxial layer;
   a plurality of source and drain regions of a second conductivity type formed in the epitaxial layer, wherein the source regions are within the channel regions and the drain regions are adjacent to the channel regions and spaced from the source regions; and
   a plurality of first regions of the first conductivity type formed in the epitaxial layer extending down to the substrate, wherein the first regions are partially overlapping the source regions and the channel regions, and wherein the plurality of first regions and the plurality of source regions are connected through an ohmic conductive means.

2. The semiconductor device of claim 1 wherein a maximum of two sources regions each are connected through ohmic means with one first region.

3. The semiconductor device of claim 1 further comprising a plurality of second regions of the first conductivity type formed in the epitaxial layer partially overlapping and beneath the channel regions, wherein the second regions are more heavily doped than the channel regions.

4. A semiconductor device, comprising:
   a substrate of a first conductivity type;
   an epitaxial layer of the first conductivity type disposed on the substrate, wherein the epitaxial layer has a top surface and a bottom surface;
   a first region of the first conductivity type formed in the epitaxial layer, extending from the top surface down to the substrate, wherein the first region is more heavily doped than the epitaxial layer;
   a second region of the first conductivity type formed in the epitaxial layer, extending from the top surface down into a portion of the epitaxial layer;
   a gate region disposed on the epitaxial layer; and
   a source and a drain region of a second conductivity type formed in the epitaxial layer extending from the top surface down into a portion of the epitaxial layer, wherein the source and drain regions are shallower than the second region and the source and the drain regions are separated by the gate region, and further wherein the source region is formed inside the second region and the first region is shorted to the source region, and wherein the drain region is adjacent the first region.

5. The semiconductor device of claim 4 further comprising a third region of the first conductivity type formed in the epitaxial layer, extending from the top surface down into a portion of the epitaxial layer partially inside the second region and the source, and wherein the third region is deeper and more heavily doped than the second region.

6. The semiconductor device of claim 4 wherein the drain region is comprised of a lightly doped region and a more heavily doped region.

7. The semiconductor device of claim 4 wherein a single level of metal on the top surface is required to perform all necessary interconnects to the source, drain and gate regions.

8. A semiconductor device, comprising:
   a substrate of a first conductivity type;
   an epitaxial layer of the first conductivity type formed on the substrate;
   a plurality of first regions of the first conductivity type formed in the epitaxial layer, and wherein each first region is more heavily doped than the epitaxial layer;
   a plurality of gate regions formed on the epitaxial layer; and
   a plurality of source and drain regions of a second conductivity type formed in the epitaxial layer, separated by the gate region, wherein a maximum of two source regions each are electrically connected with each first region.

9. A semiconductor device, comprising:
a semiconductor die having a front side and a back side;
a plurality of gate regions formed on the front side;
a plurality of drain regions formed on the front side each adjacent one of the plurality of gate regions;
a plurality of source regions formed on the front side each adjacent one of the plurality of gate regions; and
a plurality of first doped regions individually electrically connected to a maximum of two source regions on the front side and providing a conductive means to the back side of the die.

* * * * *

UNITED STATES PATENT AND TRADEMARK OFFICE
CERTIFICATE OF CORRECTION

PATENT NO. : 5,155,563
DATED : October 13, 1992
INVENTOR(S) : Davies et al.

It is certified that error appears in the above-identified patent and that said Letters Patent is hereby corrected as shown below:

Column 4,
Line 23, replace "first" with -- second --.

Signed and Sealed this

Twenty-ninth Day of July, 2003

JAMES E. ROGAN
*Director of the United States Patent and Trademark Office*

UNITED STATES PATENT AND TRADEMARK OFFICE
CERTIFICATE OF CORRECTION

PATENT NO. : 5,155,563
DATED : October 13, 1992
INVENTOR(S) : Davies et al.

It is certified that error appears in the above-identified patent and that said Letters Patent is hereby corrected as shown below:

Column 4,
Line 39, replace "first" with -- second --.

This certificate supersedes Certificate of Correction issued July 29, 2003.

Signed and Sealed this

Twelfth Day of October, 2004

JON W. DUDAS
*Director of the United States Patent and Trademark Office*